(12) United States Patent
Bulk et al.

(10) Patent No.: US 6,565,166 B1
(45) Date of Patent: May 20, 2003

(54) CABINET ASSEMBLY

(76) Inventors: Thomas Bulk, 4655 Alpglen Ct., Colorado Springs, CO (US) 80906; Kevin Sheahan, 4190 Danceglen Dr., Colorado Springs, CO (US) 80906

( * ) Notice: Subject to any disclaimer, the term of this patent is extended or adjusted under 35 U.S.C. 154(b) by 0 days.

(21) Appl. No.: 09/573,524

(22) Filed: May 17, 2000

(51) Int. Cl.⁷ .............................................. A47B 47/04
(52) U.S. Cl. .................................. 312/257.1; 312/223.6
(58) Field of Search ......................... 312/257.1, 263, 312/265.5, 223.6, 213, 204, 108, 223.3, 223.5, 114, 102; 174/48, 50; 108/50.02

(56) References Cited

U.S. PATENT DOCUMENTS

| | | | | |
|---|---|---|---|---|
| 2,899,523 A | * | 8/1959 | Jacobs | 312/223.5 X |
| 3,588,212 A | * | 6/1971 | Gersch | 312/204 X |
| 5,048,902 A | * | 9/1991 | Daly | 312/257.1 X |
| 5,176,435 A | * | 1/1993 | Pipkens | 312/204 |
| 5,368,380 A | * | 11/1994 | Mottmiller et al. | 312/263 |
| 5,466,058 A | * | 11/1995 | Chan | 312/263 X |
| 5,518,310 A | * | 5/1996 | Ellman et al. | 312/223.6 X |
| 5,577,819 A | * | 11/1996 | Olsen | 312/223.6 X |
| 5,897,180 A | * | 4/1999 | Singer | 312/257.1 X |
| 5,931,553 A | * | 8/1999 | Cohen | 312/263 |
| 5,994,644 A | * | 11/1999 | Rindoks et al. | 312/223.6 X |
| 6,099,092 A | * | 8/2000 | Uffner et al. | 312/263 X |
| 6,359,217 B1 | * | 3/2002 | Thompson et al. | 312/223.6 X |

* cited by examiner

Primary Examiner—James O. Hansen
(74) Attorney, Agent, or Firm—William E. Hein

(57) ABSTRACT

Molded plastic wall and floor mount cabinets include integral preformed electrical wire pathways, electrical boxes for mounting power receptacles or switches, junction boxes for housing interconnecting wiring, and lighting component areas. Both the wall and floor mount cabinets include a plastic primary structure that may either be a unitary molded box-like structure or a combination of top, bottom, rear, front, and side members that are then connected together.

4 Claims, 15 Drawing Sheets

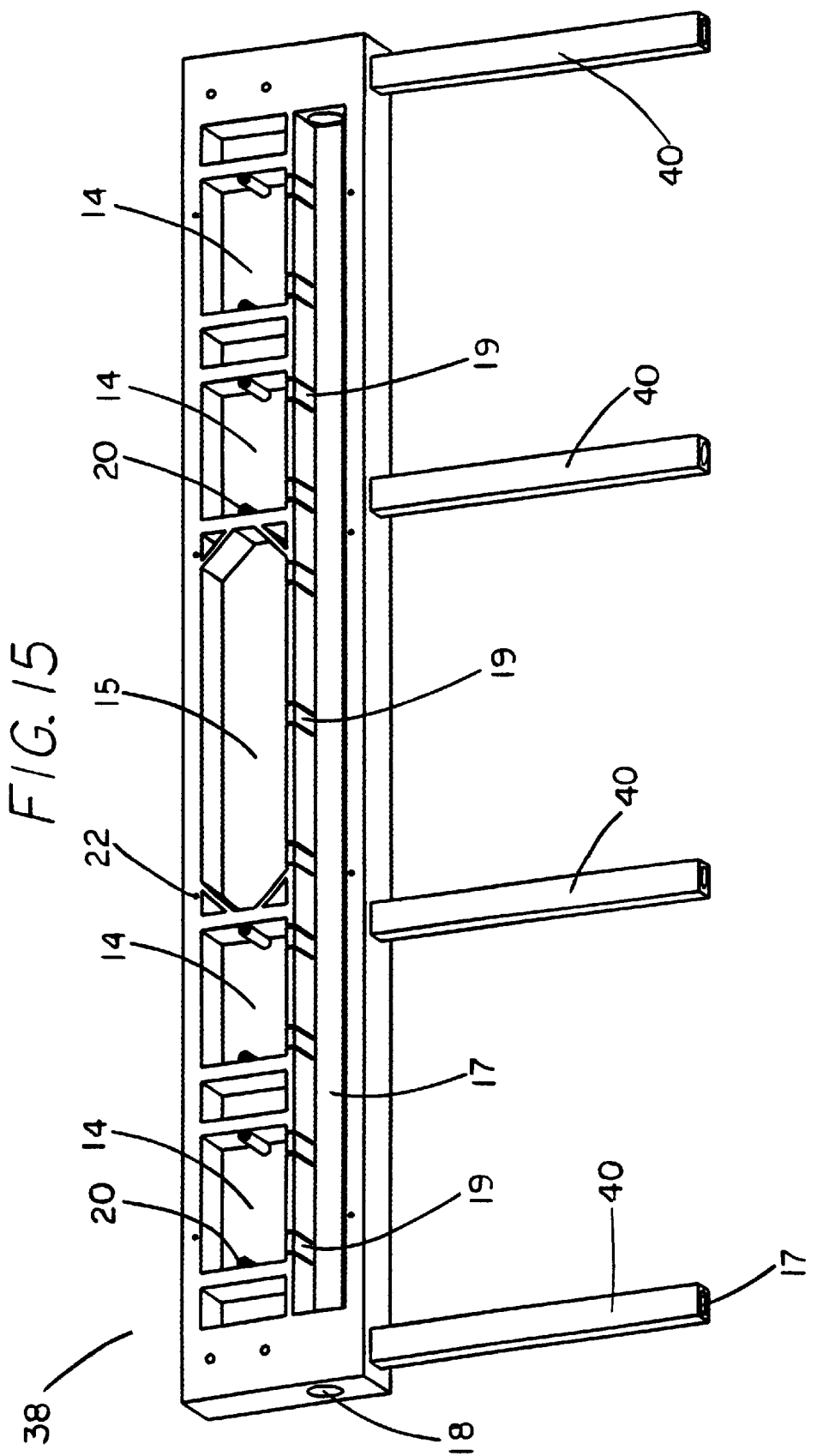

CABINET ASSEMBLY

BACKGROUND AND SUMMARY OF THE INVENTION

This invention relates generally to cabinets and, more specifically, to cabinets made of plastic injection molded parts and that house electrical wiring.

Cabinet assemblies are well known in the consumer market, and, in general, are multi-piece structures consisting of one or more doors, a top, bottom, two sides, a rear wall, and one or more shelves. They are used for the storage of various items ranging from food and clothing to tools, etc. Historically, cabinet assemblies have been fabricated of some sort of wood product, either wood pieces themselves or high-density pressed wood type products that have a stained outer surface. Cabinets of this type are found in many areas of the home, such as the kitchen, laundry room, garage, etc.

Traditionally, electrical boxes have been located adjacent to cabinets for powering appliances and tools, controlling lighting, and providing connections to telephone and cable TV services. These conventional electrical boxes, made of plastic or metal, along with associated wiring, reside within and behind adjacent walls. The electrical boxes are typically mounted on metal or wooden wall studs above the countertops and, in some cases, are also provided above wall-mounted cabinets to facilitate the use of indirect lighting. All of the wire routing methods and electrical boxes that contain components such as switches and plug receptacles must meet regional requirements for safety that are generally specified by the National Electrical Code.

Prior art cabinets have been primarily designed as stand-alone building components for storage only. Electrical lighting fixtures, appliances, and other electrical products have been attached externally to either the bottom or top of cabinets in an effort to improve lighting or reduce countertop clutter.

The recent evolution of plastics has resulted in innovations in the fabrication of storage cabinets and bins. For example, U.S. Pat. No. 5,368,380 to Mottmiller et al. describes a plastic cabinet design in which a door hinge mechanism is integrated with top and bottom members and in which molded panel locking mechanisms facilitate easy assembly of the cabinet by the user.

A similar prior art general use plastic cabinet is described in U.S. Pat. No. 5,931,553 to Cohen, in which separate molded top, bottom, back, and side members include internal and external webbing for added strength. Metal hinges are used to attach the door, and the remaining components are attached by a combination of attachment hardware and molded interlocks.

The need for housing electrical wiring and associated components, such as receptacles, switches, and lighting within a cabinet assembly has not been addressed in the prior art.

It would therefore be advantageous to provide a cabinet assembly that incorporates home electrical wiring, plug receptacles, switches, lighting, appliance holders, and other special features.

It would be further advantageous to provide a plastic primary cabinet structure having top, bottom, side, and rear panel members to thereby form a box-like cabinet.

It would be further advantageous to provide a primary plastic cabinet structure fabricated as either a single molded box-like structure or a combination of individual top, bottom, rear, front, and side members that are then bonded together.

It would be further advantageous to provide separate plastic primary wall mount and floor mount cabinet structures.

It would be further advantageous to provide a wall or floor mount cabinet assembly incorporating one or more integral electrical wire pathways, one or more electrical boxes, one or more electrical junction boxes, and one or more regions for lights and lighting components.

It would be further advantageous to provide a wall or floor mount cabinet assembly incorporating preformed injection molded electrical boxes, junction boxes, electrical pathways, and lighting regions for accepting commercially available plug receptacles, switches, and lighting.

It would be further advantageous to provide a wall or floor mount cabinet assembly incorporating appliances that may be attached to the bottom of a wall mount cabinet assembly or that may reside in the drawers or doors of a floor mount cabinet assembly.

It would be further advantageous to provide a wall or floor mount cabinet assembly incorporating dimensionally correct preset holes for door and door closure hardware mounting to thereby accommodate either wood or plastic doors that may be easily installed.

It would be further advantageous to provide an injection molded floor mount cabinet assembly incorporating preformed drawer tracks and an area for attaching a child safety lock.

It would be further advantageous to provide a cabinet assembly that accommodates the installation of bottom, top, and side plastic sheets that may be covered by wood veneer outer pieces or be replaced with wood panels, thus providing a wood finished outer appearance.

BRIEF DESCRIPTION OF THE DRAWINGS

FIG. 15 is an enlarged pictorial diagram of the power strip assembly portion of the fully assembled floor mount cabinet of FIG. 8.

DETAILED DESCRIPTION OF THE PREFERRED EMBODIMENTS

Figure 1:
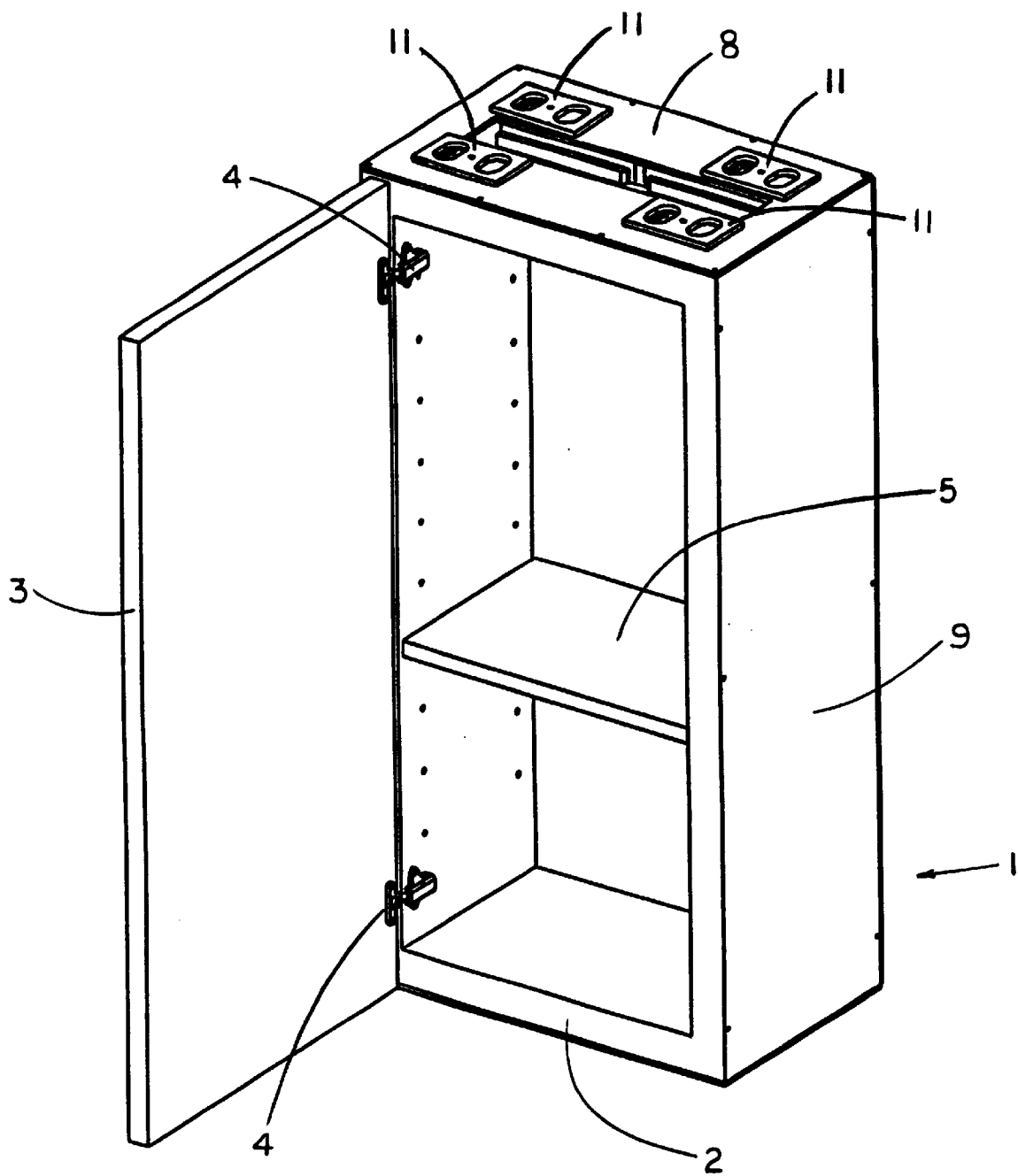
FIG. 1 is a top pictorial diagram of a fully assembled wall mount cabinet in accordance with the present invention.
Figure 2:
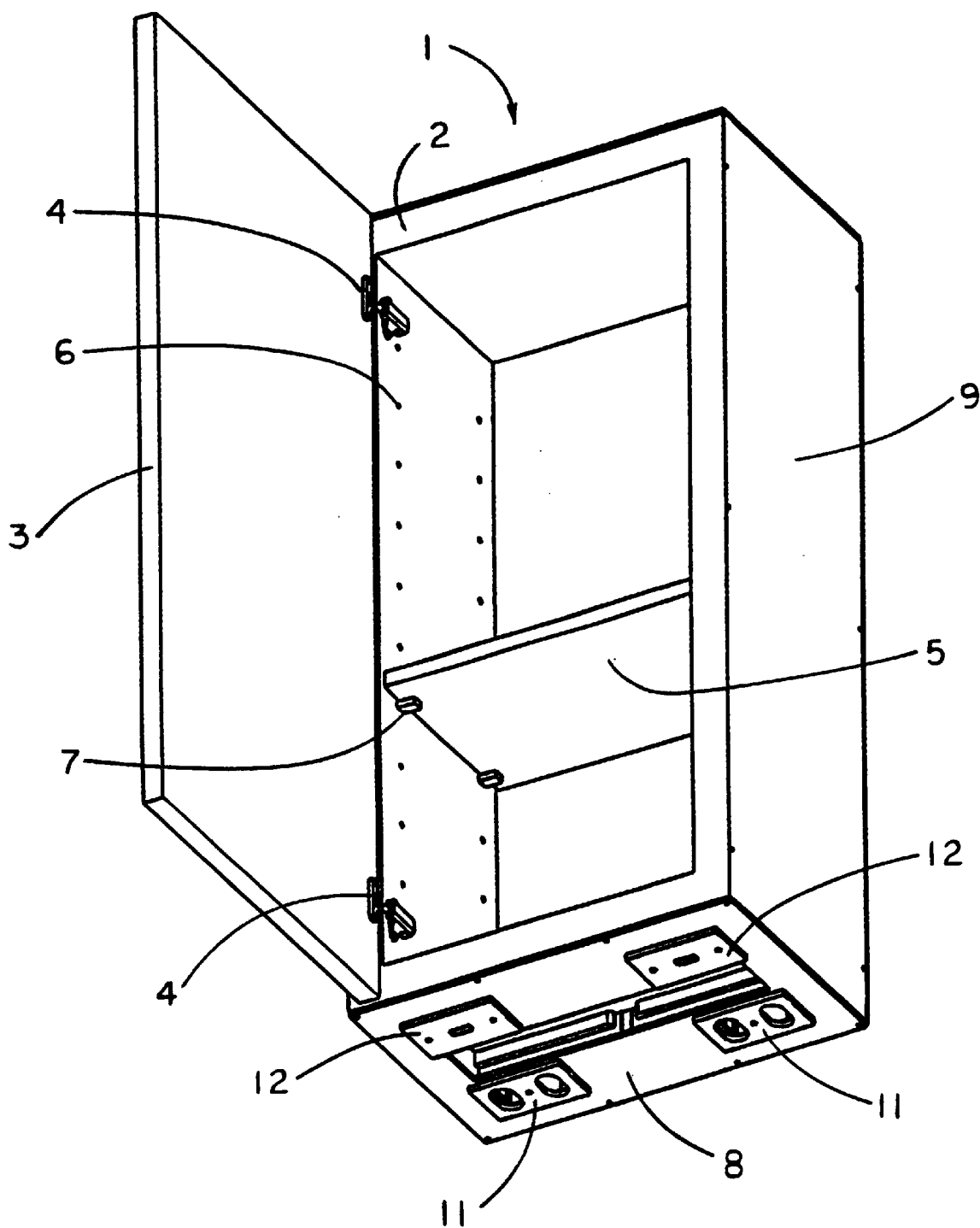
FIG. 2 is a bottom pictorial diagram of the wall mount cabinet of FIG. 1.

Referring now to FIGS. 1 and 2, there is shown a fully assembled wall mount cabinet 1 in accordance with the present invention. Wall mount cabinet 1 is constructed as a single primary box-like structure 2 that may be fabricated as a single injection molded structure or as a combination of side, top, bottom, and rear panels that are then connected together to form a rigid box structure. One or more doors 3, that may be fabricated of wood or plastic, are attached to the primary structure 2 using commercially available hinges 4. One or more shelves 5, that may also be fabricated of wood or plastic, are supported by commercially available plastic or metal inserts 7 positioned in selected ones of a multiplicity of preformed molded holes 6. Plastic or wood panels cover the top, bottom, and sides, as described hereinbelow.

Figure 3:
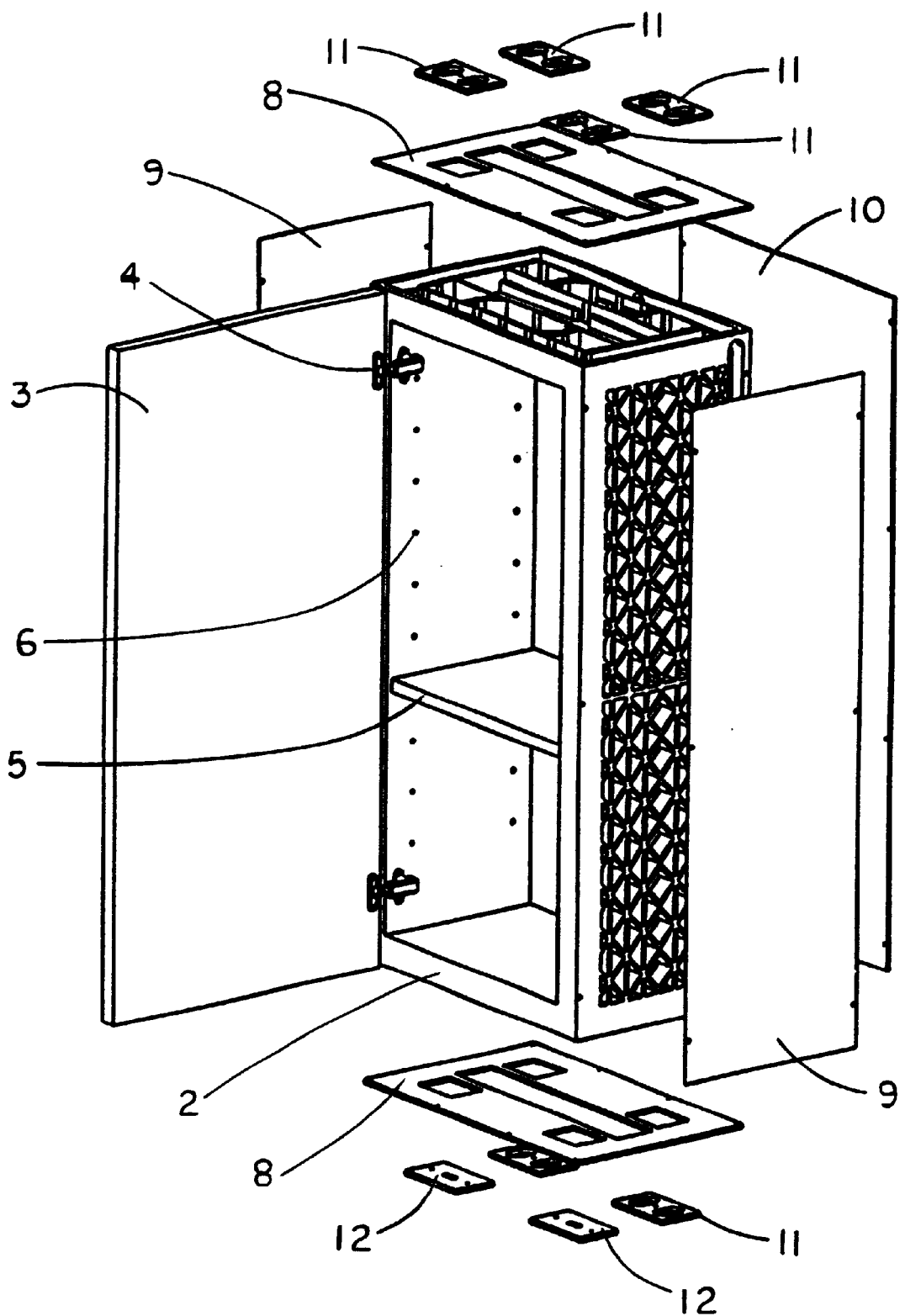
FIG. 3 is an assembly diagram of the wall mount cabinet of FIGS. 1 and 2.

Referring now to FIG. 3, there is shown an assembly diagram of the wall mount cabinet 1 of FIGS. 1 and 2, which includes the primary structure 2 covered by plastic or wood side panels 9, top and bottom panels 8, and a rear panel 9. Commercially available electrical receptacle covers 11 and switch plates 12 serve to cover one or more electrical boxes that are preformed in the top and bottom of the primary structure 2, as described below.

Figure 4:
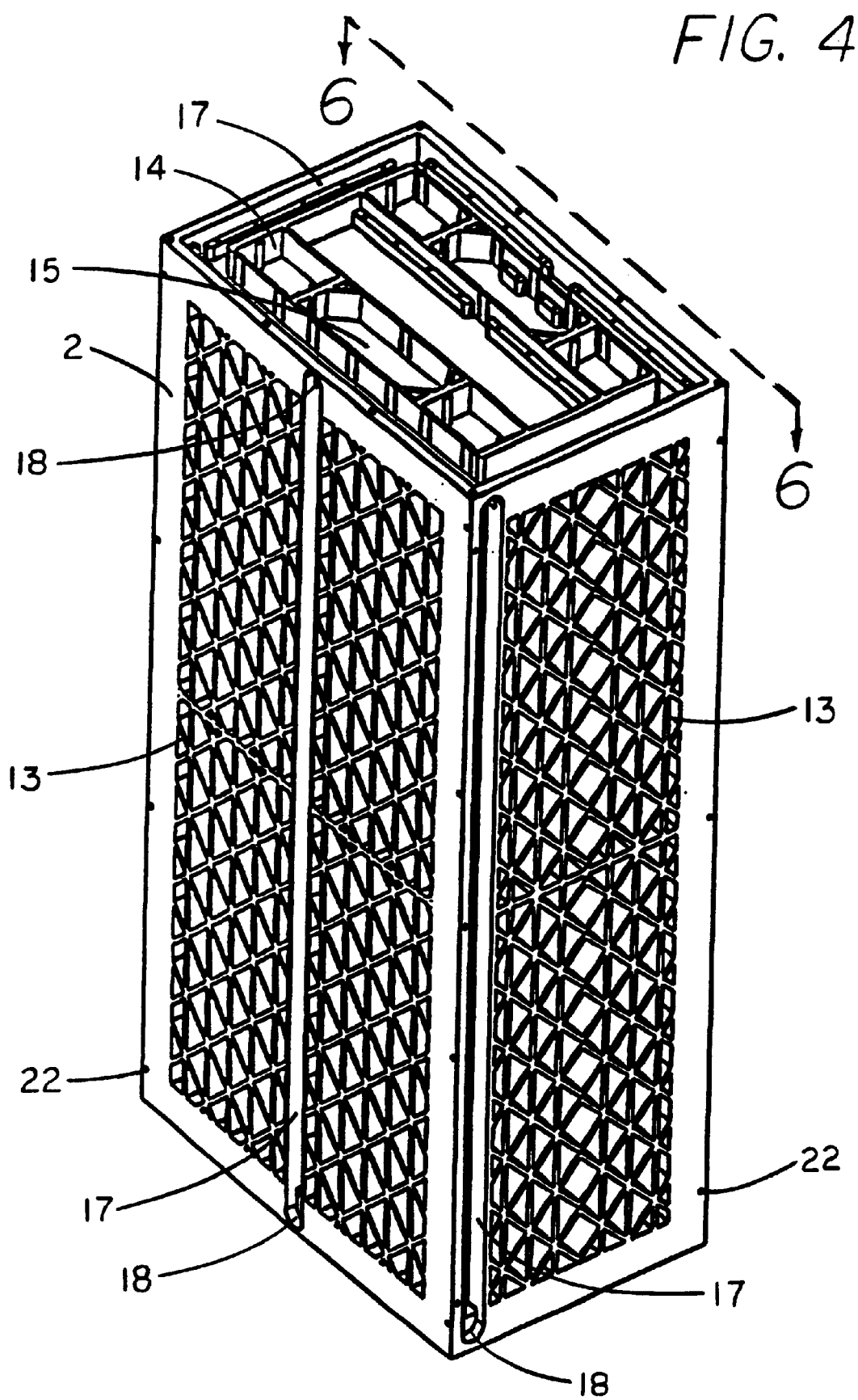
FIG. 4 is a top pictorial diagram illustrating the primary cabinet structure of the wall mount cabinet of FIG. 1–3.
Figure 5:
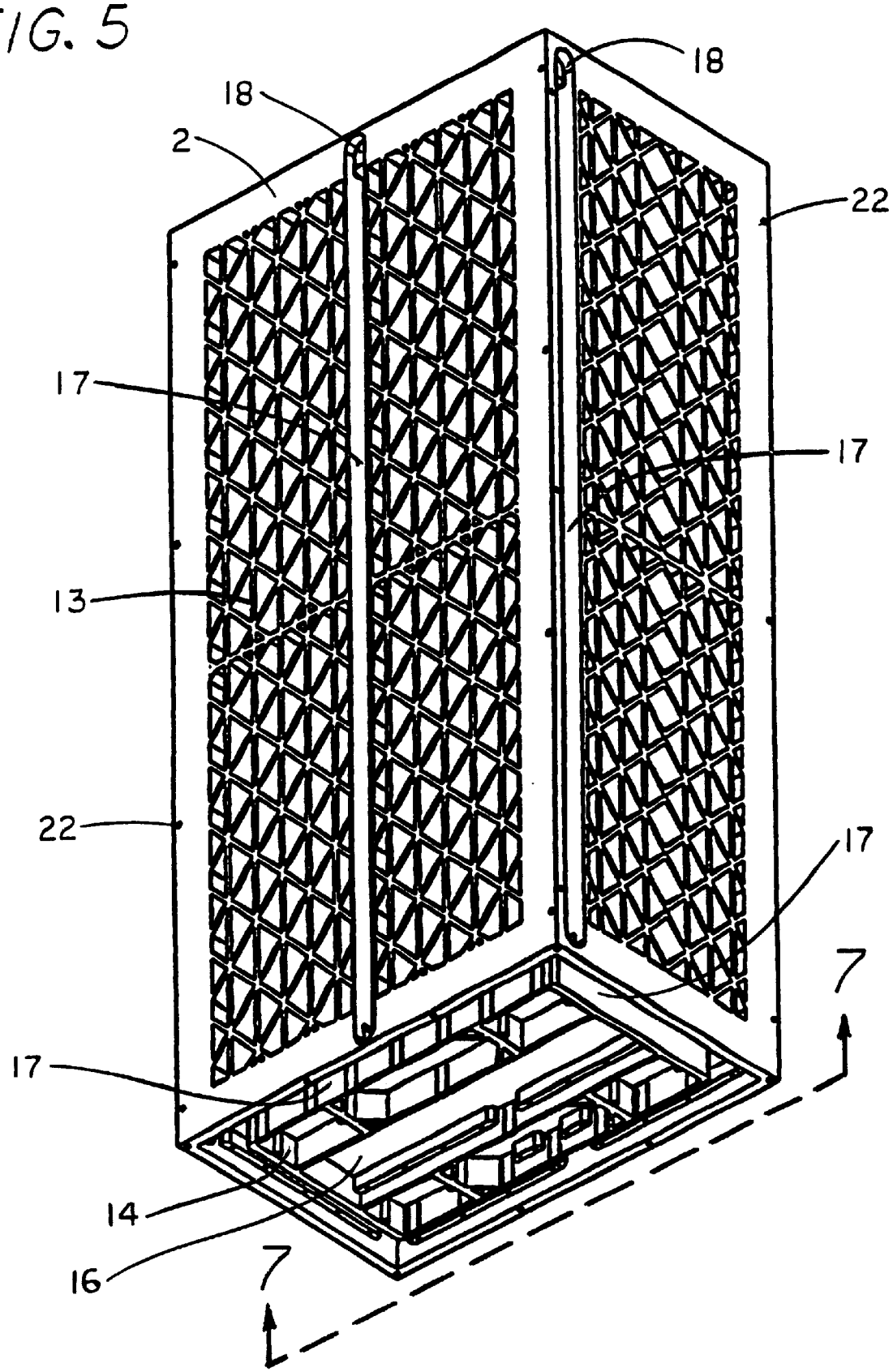
FIG. 5 is a bottom pictorial diagram illustrating the primary cabinet structure of FIG. 4.

Referring now to FIGS. 4 and 5, one or more electrical boxes 14, electrical junction boxes 15, electrical wire pathways 17, and lighting component areas 16 are preformed in identical layouts in both the top and bottom of primary structure 2. Lighting component areas 16 may house various fluorescent or low voltage lighting components. Structural webbing 13 and additional wire pathways 17 are provided on the sides and rear of primary structure 2 to aid the user during the initial installation and subsequent maintenance of electrical wiring. The top and bottom plastic covers 8, illustrated in FIG. 3, are molded to cover the wire pathways 17 and junction boxes 15 in the top and bottom of the primary structure 2, while leaving the electrical boxes 14 and lighting component areas 16 open to access by the user. The electrical receptacle covers 11 and switch plates 12 illustrated in FIG. 3 may be applied after electrical inspection and verification of the installation have been completed.

Figure 6:
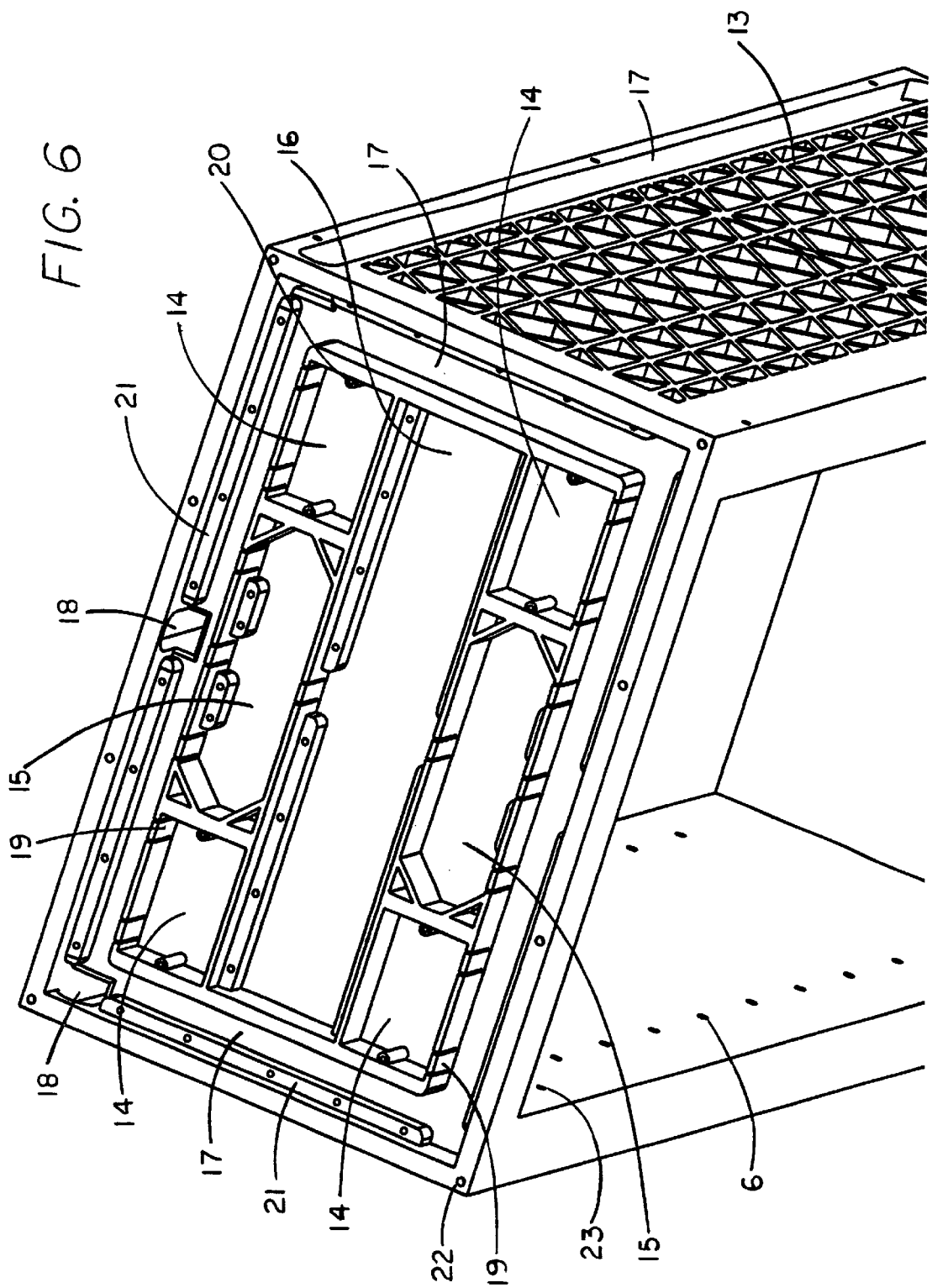
FIG. 6 is an enlarged view of the top portion of the primary cabinet structure of FIG. 4.
Figure 7:
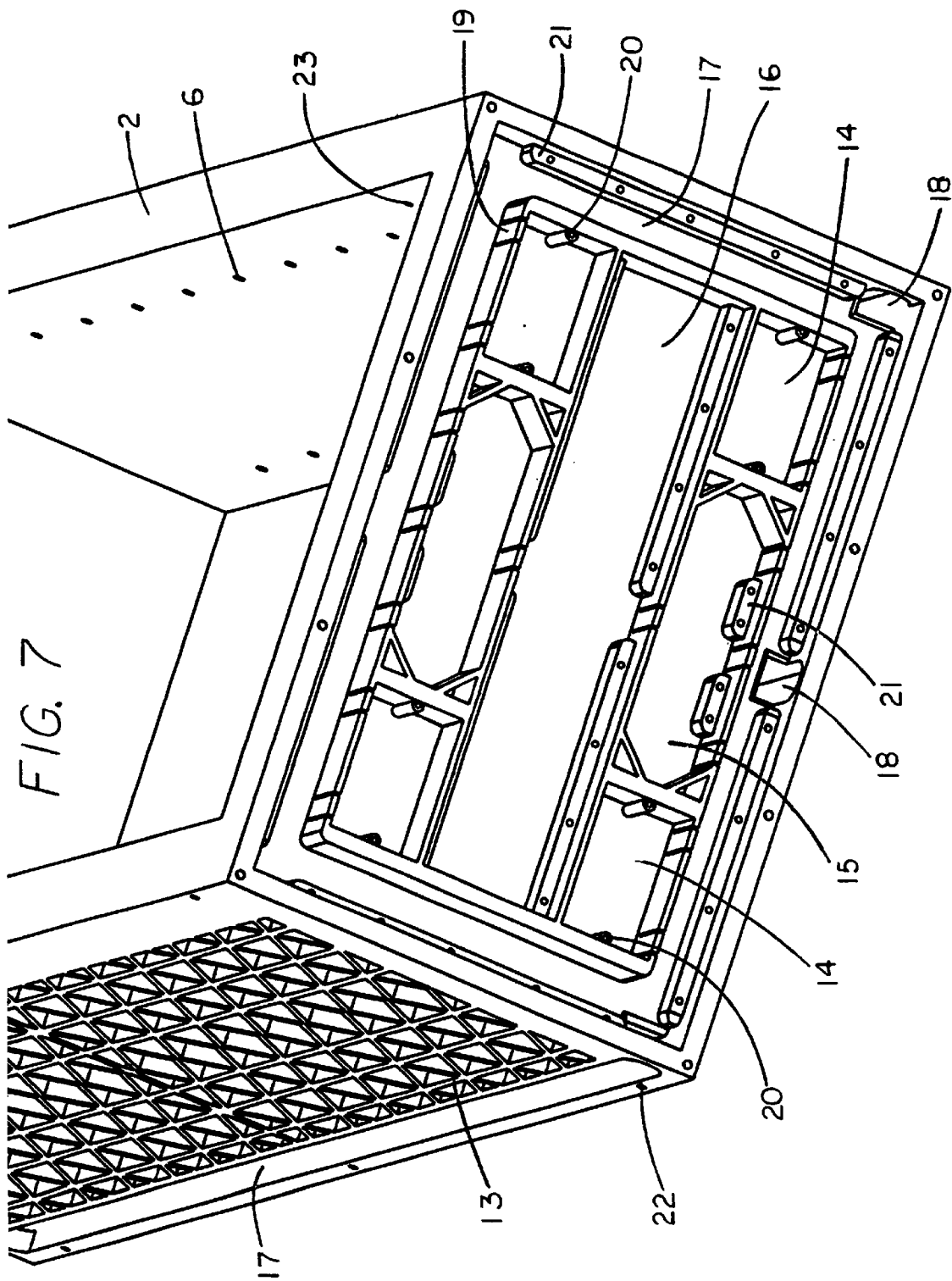
FIG. 7 is an enlarged view of the bottom portion of the primary cabinet structure of FIG. 4.

Referring now to FIGS. 6 and 7, there are shown enlarged views of the primary structure 2 of FIGS. 4 and 5. As stated above, the top and bottom of primary structure 2 are identical in layout and are preformed to provide the user with the ability to locate commercially available electrical plug receptacles, switches, lighting, cable TV jacks, phone jacks, etc., as well as nonmetallic sheathed wiring that interconnects these components within the confines of the top and bottom of the primary structure 2. A total of six wire entrances 18 are provided, three in the top and three in the bottom, to allow the user to route wiring into the primary structure 2. The wire pathways 17 within primary structure 2 permit the routing of wire to the electrical boxes 14 and/or the junction boxes 15. Molded lips 21 having screw holes therein are provided within the wire pathways 17 located in the top and bottom of primary structure 2 to permit the user to clamp wiring as it is routed to the electrical boxes 14 and/or junction boxes 15. Each of the preformed electrical boxes 14 and junction boxes 15 includes one or more designated punch-out areas 19 in side walls thereof through which wiring may be routed. Each of the preformed electrical boxes 14 includes preformed screw holes 20 located to accept commercially available switch and plug receptacles. Each of the junction boxes 15 also includes molded lips 21 that permit wiring routed therethrough to be clamped or held to the primary structure 2 before adding the top and bottom plastic covers 8. The top and bottom covers 8 are mounted to the primary structure 2 using standard screws that are screwed into holes 22 provided in the corners of the primary structure 2. Door hinges 4 are conventionally mounted over screw holes 23.

Referring now variously to FIGS. 8–11, there is shown a fully assembled floor mount cabinet 25 having a pair of doors 27. Like the wall mount cabinet 1 described above, floor mount cabinet 25 is constructed as a primary box-like structure 26 that may be fabricated as a single injection molded structure or as a combination of side, top, bottom, and rear panels that are then connected together. Unlike the wall mount cabinet 1, all of the provisions for electrical wiring and components reside within an inner back wall of the floor mount cabinet 25. Within the back wall are preformed regions containing electrical boxes 14, junction boxes 15, and wire pathways 17. Doors 27, which may be conventionally fabricated of wood or plastic, are attached to the primary structure 26 using conventional hinges 4. One or more shelves 28, that may also be fabricated of wood or plastic, are supported by commercially available plastic or metal inserts 7 that are positioned in selected ones of a multiplicity of preformed molded holes 6. Molded plastic drawers 42 fit into the primary structure 26 by means of preformed molded roller guides 33 or roller guide holders. An inner roller guide member 41, which may be a separate molded assembly, accommodates the inner roller guides 33 or roller guide holders. Like the primary structure 26 itself, drawers 42 are constructed from a primary basket molded structure including the preformed roller guides 33 or roller guide holders, thus allowing the front piece to be replaced by wood. An optional molded plastic power strip assembly 37 rests on a conventional countertop that is mounted on top of floor mount cabinet 25. Power strip assembly 37 is positioned along the rear of floor mount cabinet 25 so as to be flush with the rear wall thereof and is attached thereto by means of a plurality of integral downwardly extending plastic protrusions 40 that fit into a corresponding plurality of slots 35 located on the top of the primary structure 26. A multiplicity of holes 32 are provided along the periphery of the top of primary structure 26 for securing the conventional countertop thereto. If a more aesthetically pleasing appearance is required, plastic molded side panels 29 may be applied over the primary structure 26. Alternatively, side panels 29 may be solid wood or wood veneer.

Figure 8:
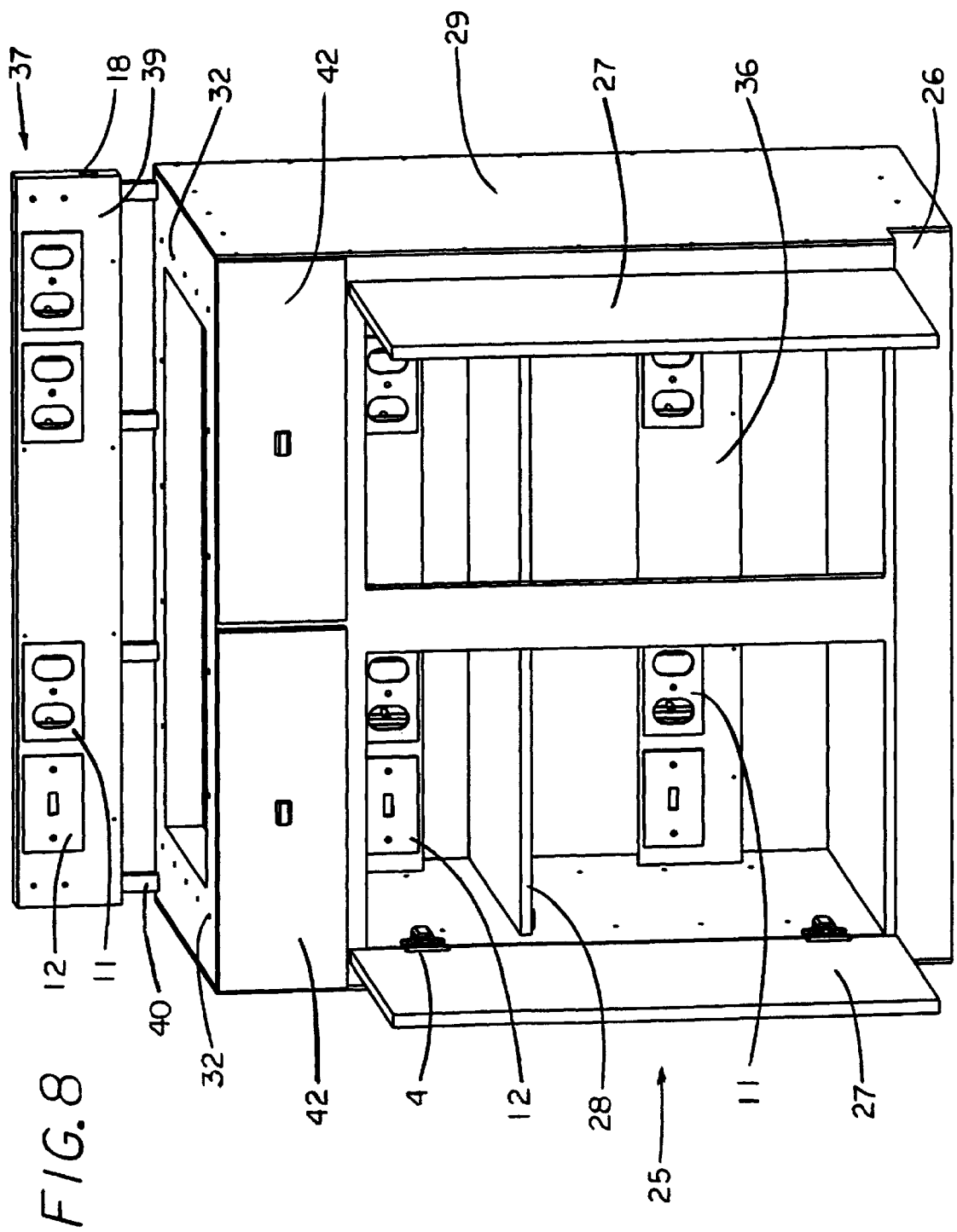
FIG. 8 is a top pictorial diagram of a fully assembled floor mount cabinet in accordance with the present invention.
Figure 9:
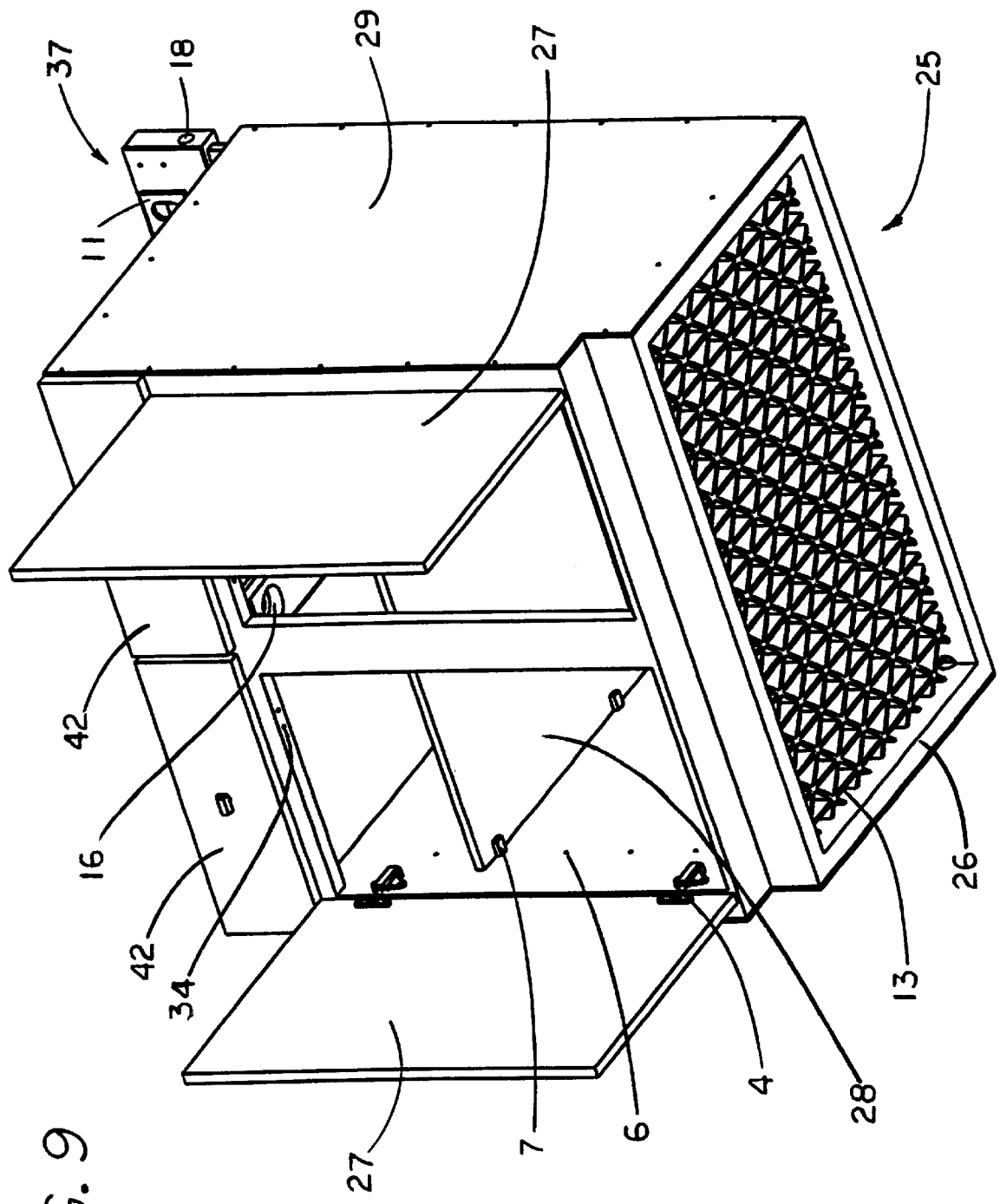
FIG. 9 is a bottom pictorial diagram of the fully assembled floor mount cabinet of FIG. 8.
Figure 10:
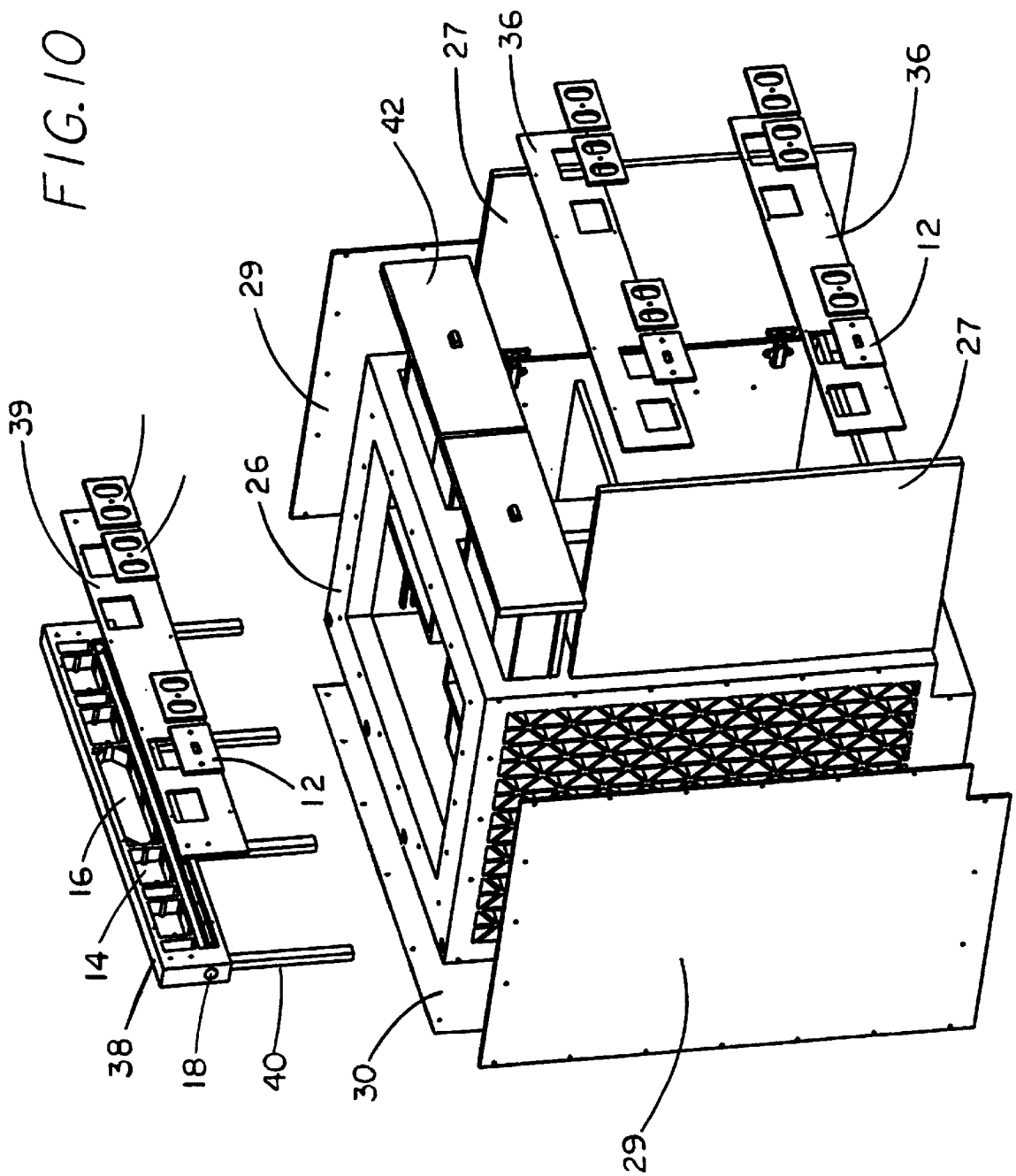
FIG. 10 is an assembly diagram of the floor mount cabinet of FIGS. 8 and 9.

Referring now to FIG. 10, there is shown an assembly diagram of the floor mount cabinet 25 of FIGS. 8 and 9. Floor mount cabinet 25 includes the primary structure 26, side panels 29, a rear panel 30, a plastic wire routing cover 36, doors 27, drawers 42, shelf 28, and power strip assembly 37.

Figure 11:
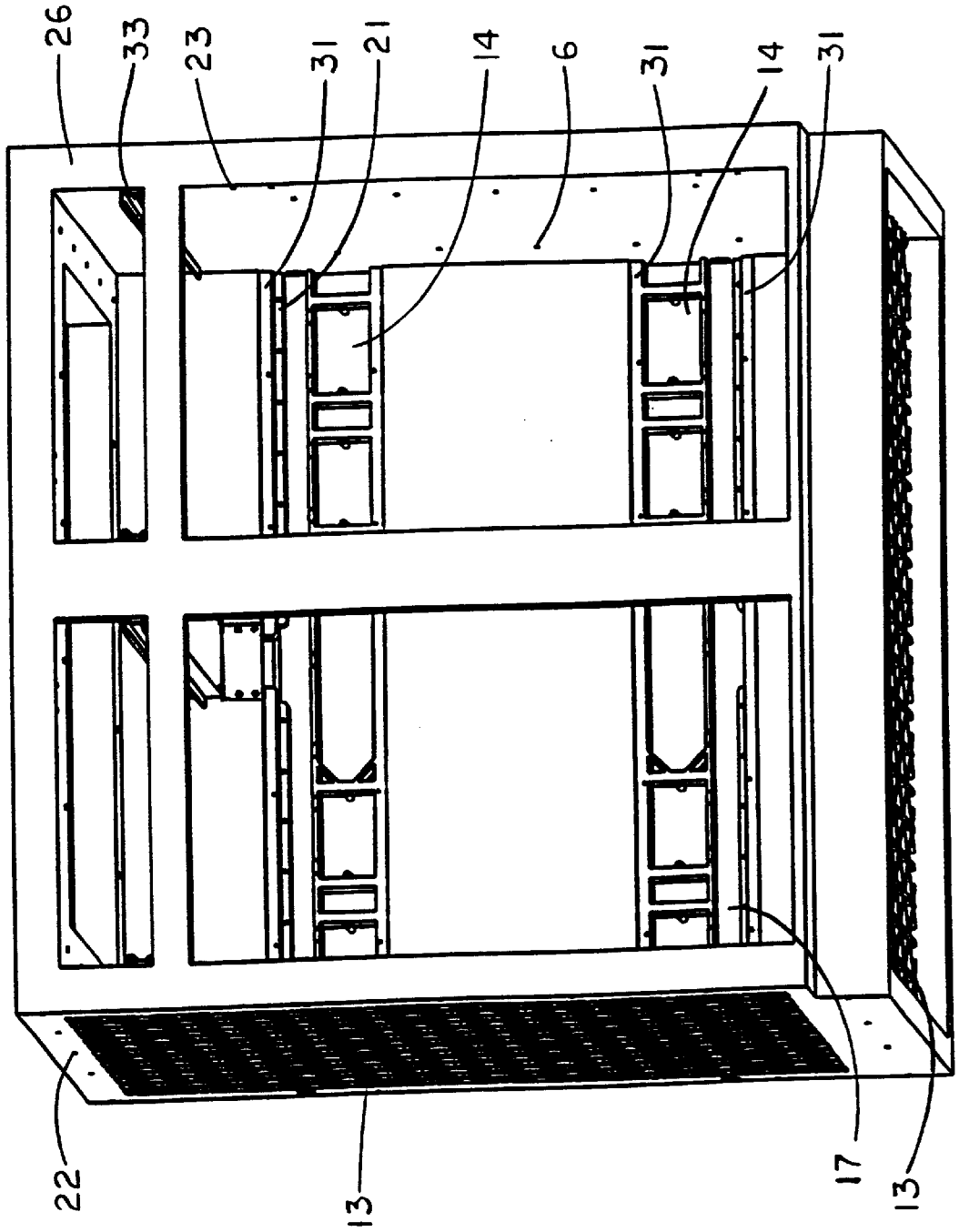
FIG. 11 is a pictorial diagram illustrating the primary cabinet structure of the floor mount cabinet of FIG. 8–10.
Figure 12:
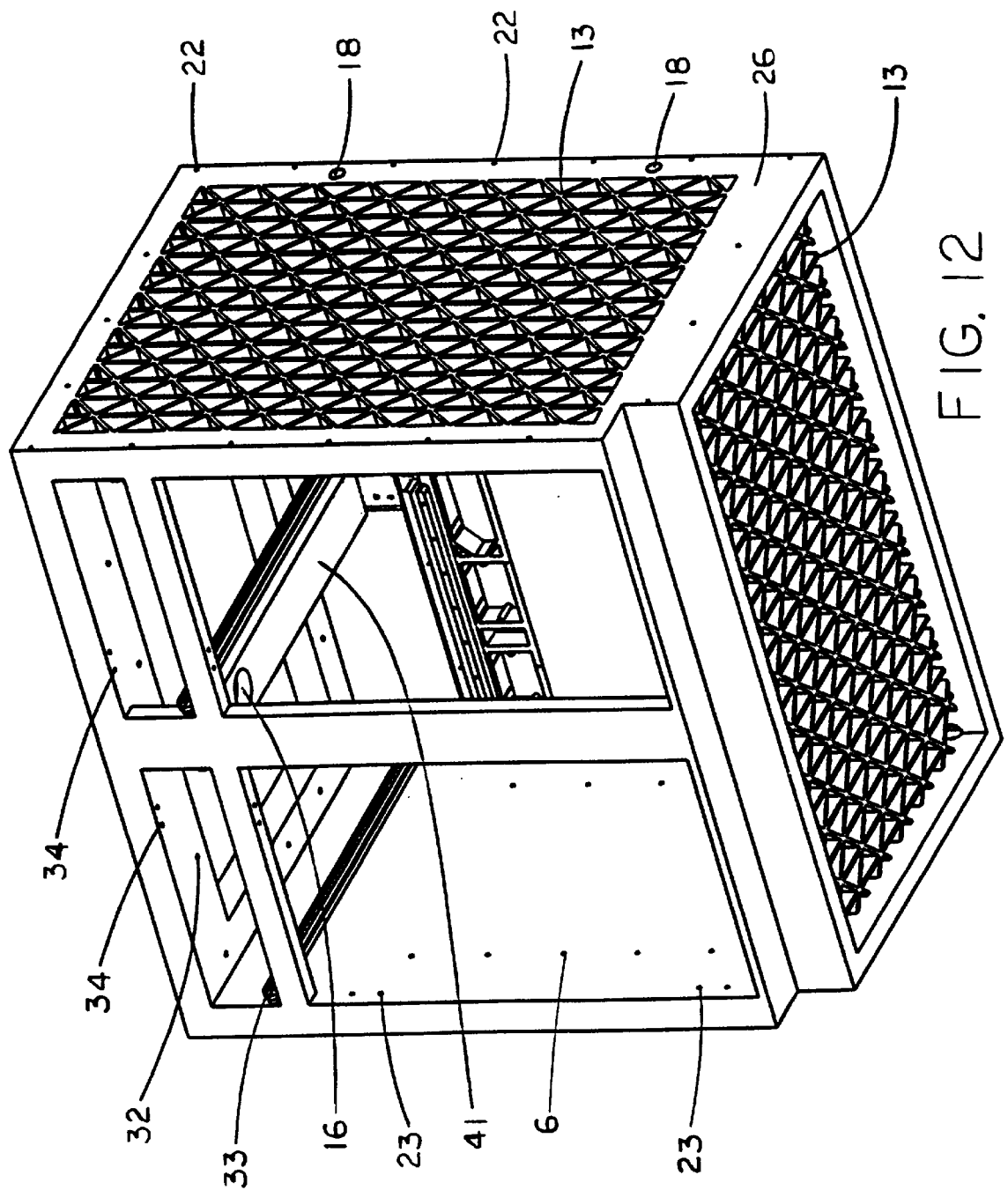
FIG. 12 is a pictorial diagram illustrating the primary cabinet structure of FIG. 11 in another view.
Figure 13:
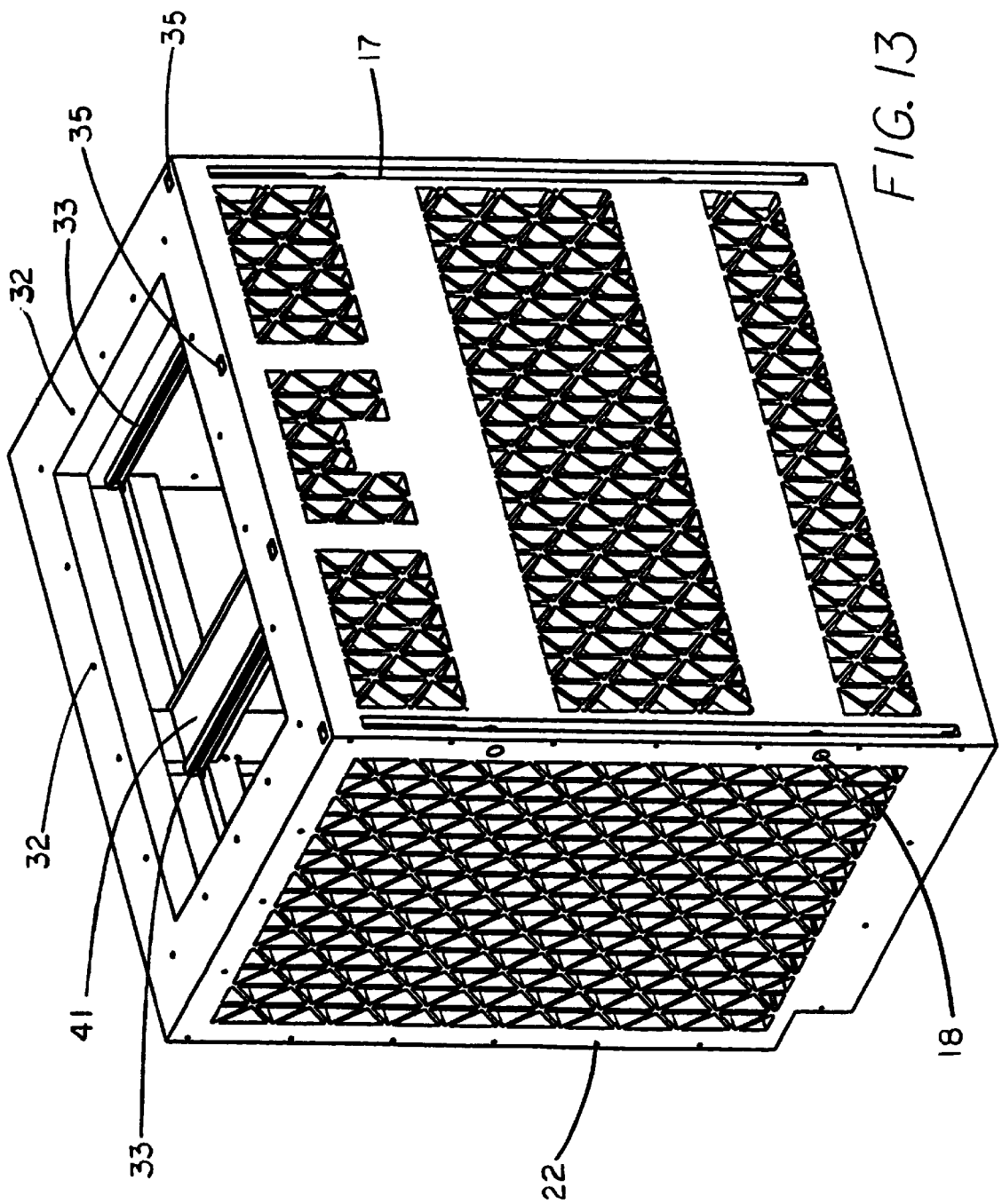
FIG. 13 is a pictorial diagram illustrating the top, left side, and rear portions of the primary cabinet structure of FIGS. 11 and 12.

Referring now to FIGS. 11–13, there are shown pictorial diagrams of the primary structure 26 of floor mount cabinet 25. As previously stated, primary structure 26 may be fabricated as a single injection molded piece or as a molded set of individual webbed top, bottom, rear, and side panels that, when connected together, provide a rigid box structure that houses preformed home/residential electrical components. Molded directly into primary structure 26 are one or more electrical boxes 14, junction boxes 15, wire pathways 17, electrical wire entrances 18, and lighting component areas 16. Selected lighting components reside within the plastic roller guide assembly 41 that connects between the front and rears walls and provides the additional preformed roller or roller guide holders 33 for the drawers 42. As shown in FIG. 11, the preformed areas that contain the electrical boxes 14 and junction boxes 15 are identical in layout and include a plastic lip 31 that provides a mounting surface for the wire routing cover 36 so that it fits flush with the rear wall of primary structure 26 to thereby enclose the wire pathways 17 and junction boxes 15, leaving the electrical boxes 14 open for access thereto. Conventional electrical receptacle covers 11 and switch plates 12, as illustrated in FIG. 8, may be applied after electrical inspection and verification of the installation have been completed.

Referring now specifically to FIG. 13, it may be seen that the that the wire entrances 18 reside on the left and right sides of the primary structure 26 and that the wire pathways 17 run from the bottom to each of the wiring regions that reside on the inner wall of the primary structure 26. On the left and right hand sides thereof are additional wire pathways that allow wires to be routed through slots 35 and into the power strip assembly 37. Structural webbing 13 throughout the sides and the rear of the primary structure 26 provides rigidity and strength.

Figure 14:
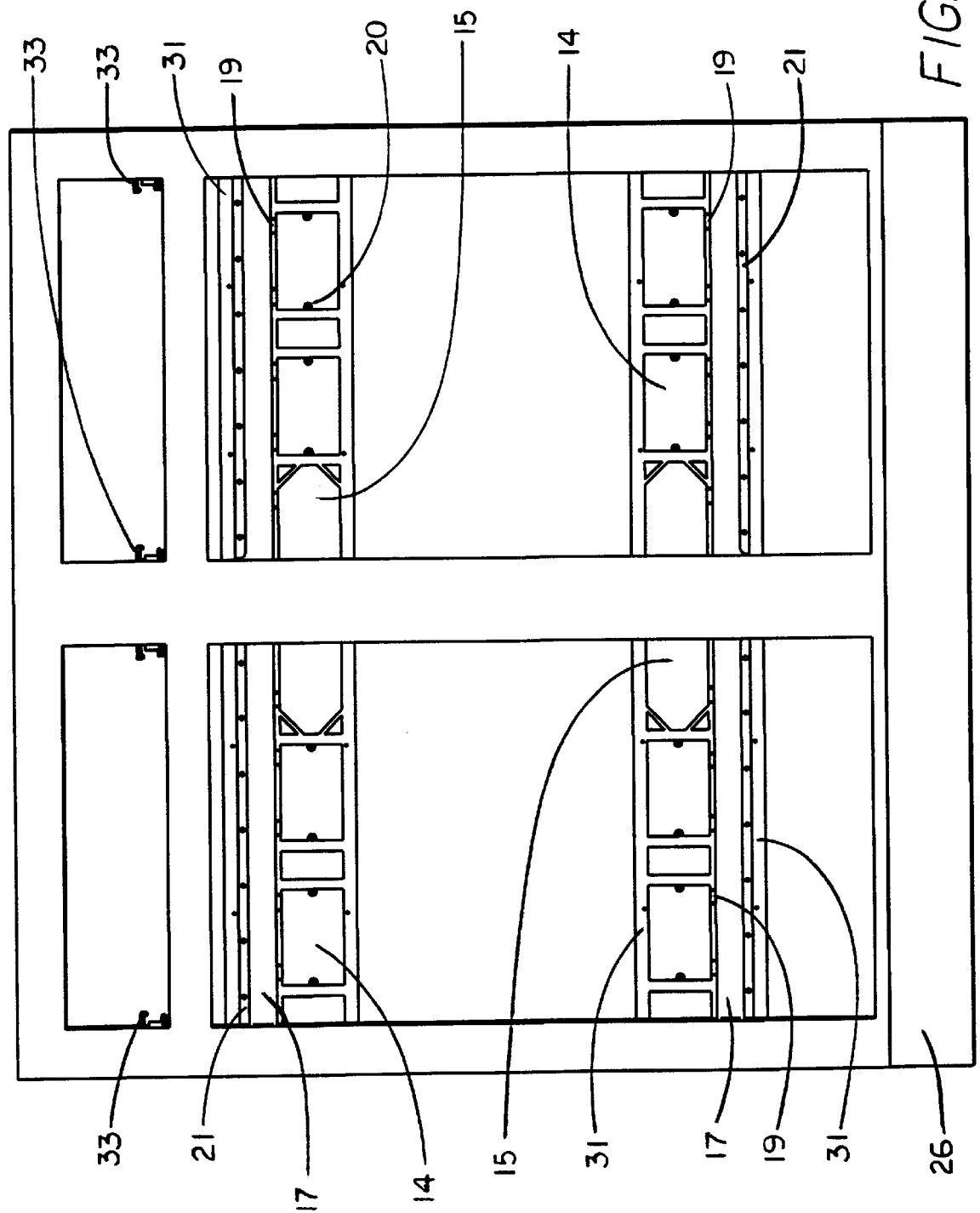
FIG. 14 is an enlarged front elevation view of a portion of the fully assembled floor mount cabinet of FIG. 8.

Referring now to the more detailed pictorial diagram of FIG. 14, there are shown the electrical wire regions containing the preformed electrical boxes 14, junction boxes 15, and wire pathways 17, as well as a wire clamping lip 21 and receptacle/switch plate mounting holes 20.

Referring finally to FIG. 15, there are shown the details of the power strip assembly 37 of FIG. 10. A power strip primary structure 38 includes one or more preformed electrical boxes 14, one or more junction boxes 15, one or more wire pathways 17, and a plurality of wire entrances 18. The downwardly extending protrusions 40 of power strip primary structure 38 are hollow to provide additional wire pathways between the primary structure 26 of floor mount cabinet 25 and the power strip primary structure 38.

We claim:

1. A plastic cabinet having at least plastic side, top, bottom, and rear members, at least one of said plastic side, top, bottom, and rear members comprising:

one or more electrical boxes preformed therein for receiving one or more selected electrical components;

one or more wire pathways preformed therein, said one or more preformed wire pathways communicating with said one or more preformed electrical boxes, said one or more preformed wire pathways being adapted for routing electrical wire to said one or more preformed electrical boxes;

one or more wire entrances preformed therein, said one or more preformed wire entrances communicating with said one or more preformed wire pathways to facilitate entry of said electrical wire into said one or more preformed wire pathways from outside said cabinet;

one or more junction boxes preformed therein, each of said one or more preformed junction boxes communicating with a selected one or more of said one or more preformed wire pathways, said one or more preformed junction boxes being adapted for retaining interconnections of said electrical wire; and one or more lighting component cavities preformed therein, each of said one or more preformed lighting component cavities communicating with one or more of said one or more preformed junction boxes, each of said one or more preformed lighting component cavities being adapted for retaining one or more selected recessed lighting components for providing illumination.

2. A plastic cabinet as in claim 1, wherein said at least one of said plastic side, top, bottom, and rear members comprises said top member.

3. A plastic cabinet as in claim 1, wherein said at least one of said plastic side, top, bottom, and rear members comprises said bottom member.

4. A plastic cabinet as in claim 1, wherein said at least one of said plastic side, top, bottom, and rear members comprises said rear member.

* * * * *